United States Patent [19]

Spak

[11] 4,220,706
[45] Sep. 2, 1980

[54] ETCHANT SOLUTION CONTAINING HF-HNO$_3$-H$_2$SO$_4$-H$_2$O$_2$ FOR ETCHING AL-TI-CU OR NI CONTACT METALLURGY ON SILICON SUBSTRATES

[75] Inventor: Mark A. Spak, Edison, N.J.

[73] Assignee: RCA Corporation, New York, N.Y.

[21] Appl. No.: 904,541

[22] Filed: May 10, 1978

[51] Int. Cl.$^2$ .................... H01L 21/44; H01L 21/88; H01L 21/465

[52] U.S. Cl. .................... 430/318; 156/657; 156/664; 156/665; 156/666; 156/656; 252/79.3; 430/316; 430/323

[58] Field of Search ............ 252/79.3; 156/656, 657, 156/664, 665, 666, 79.4; 357/71; 96/36

[56] References Cited

U.S. PATENT DOCUMENTS

| | | | |
|---|---|---|---|
| 2,974,021 | 3/1961 | Borowik | 252/79.3 |
| 3,194,703 | 7/1965 | Bloem | 156/662 |
| 3,239,440 | 3/1966 | Covington | 252/79.3 |
| 3,448,055 | 6/1969 | Mickelson et al. | 252/79.3 |
| 3,562,013 | 2/1971 | Mickelson et al. | 134/3 |
| 3,562,604 | 2/1971 | Van Laer et al. | 357/71 |
| 3,575,747 | 4/1971 | Cohn | 156/665 |
| 3,592,773 | 7/1971 | Muller | 252/79.3 |
| 3,668,131 | 6/1972 | Banush et al. | 156/664 |
| 3,844,859 | 10/1974 | Roni | 156/664 |
| 3,905,907 | 9/1975 | Shiga | 156/664 |
| 3,931,030 | 1/1976 | Ohno | 156/664 |
| 3,945,865 | 3/1976 | Kamperman | 156/664 |

FOREIGN PATENT DOCUMENTS

| | | | |
|---|---|---|---|
| 2346429 | 12/1977 | France | 252/79.3 |
| 45-04602 | 2/1970 | Japan | 252/79.3 |
| 51-91839 | 8/1976 | Japan | 252/79.3 |

Primary Examiner—Jerome W. Massie
Attorney, Agent, or Firm—Birgit E. Morris; Howard F. VanDenburgh

[57] ABSTRACT

An etchant solution for multilayered metal layers comprising an aqueous solution of from 0.5 to 50 percent by weight of nitric acid, from 0.03 to 1.0 percent by weight of hydrofluoric acid, from 0.05 to 0.5 percent by weight of hydrogen peroxide and from 0.1 to 1.0 percent by weight of sulphuric acid. The solution is compatible with photolithographic techniques and uniformly etches three or more metals.

5 Claims, No Drawings

ETCHANT SOLUTION CONTAINING HF-HNO$_3$-H$_2$SO$_4$-H$_2$O$_2$ FOR ETCHING AL-TI-CU OR NI CONTACT METALLURGY ON SILICON SUBSTRATES

This invention relates to an etchant for multilayered metals. More particularly this invention relates to an etchant for various metals which etches them at similar etch rates.

BACKGROUND OF THE INVENTION

In the manufacture of power devices such as silicon controlled rectifiers, horizontal deflector transistors and the like, several metal layers are applied over glass or silicon surfaces. These metals must be etched away in predetermined places to reveal the substrate beneath. Since metals generally etch at different rates in a single etchant, in order to closely control the process, a different etchant can be employed for each metal present; however, this is a cumbersome and expensive process.

It would be desirable to have a single etchant which can etch several metals at similar rates. However, the requirements for such an etchant are stringent. A single etchant solution must be able to etch different metals at about the same rate across the whole surface of the coated substrate; that is, the etch rate should be uniform at the edges and across the surface of the device, as well as for the different metals to be etched. The etchant must also avoid undercutting the layers. That is, a good etchant will minimize interaction between the various metals which would cause undercutting of the various metal layers. In addition, the etchant must be compatible with conventional photolithographic techniques. The etchant should not attack the photoresist coating or cause a loss of adhesion of the photoresist to the metal layer beneath which would cause undue undercutting and loss of resolution of the desired pattern. Finally, the etchant should not adversely affect the exposed substrate.

SUMMARY OF THE INVENTION

The etchant solution of the invention comprises from about 0.5 to about 50 percent by weight of nitric acid; from about 0.03 to 1.0 percent by weight of hydrofluoric acid, from about 0.05 to 0.5 percent by weight of hydrogen peroxide, and from about 0.1 to 1.0 percent by weight of sulphuric acid in an aqueous solution. A surface active agent can be added to improve the wetting properties of the solution. This etchant etches various metals at a uniform rate; is compatible with conventional photoresists; does not promote interaction between the metals during etching; and has minimal effect on insulating substrates.

DETAILED DESCRIPTION OF THE INVENTION

Various power devices comprise three or more layers of metal over an insulating substrate. These metals may include aluminum as a first layer which gives a good bond to the substrate; titanium, molybdenum or tungsten as the second layer; these metals adhere to aluminum and act as a barrier layer to prevent diffusion of nickel or copper into the substrate and prevent reaction of these metals to the aluminum; and nickel or copper as the third layer. These latter metals give good contact to titanium for example, and are solderable metals. A fourth layer of copper can be put down between the nickel and the titanium, or, alternatively, layers of nickel and copper can be alternated as the third layer.

The thicknesses of these layers can vary from about 0.1 to 8 microns for the aluminum layer; from about 0.2 to about 0.7 micron for the second layer and from about 0.4 to 2 microns for the third layer. These layers are applied to the substrate using conventional evaporation techniques.

The substrate can be glass or other silicon-containing material such as silicon, doped silicon, polycrystalline silicon whether undoped or doped with oxygen for example, silicon oxide or silicon nitride.

In preparing electronic devices such as power devices, a substrate is covered with the multilayers of metal and then coated with a photoresist. The photoresist is exposed to light of an appropriate wavelength through a mask, which changes the solubility of the resist. The resist is developed in a suitable solvent which dissolves the more soluble portions to reveal the underlying metal layers in a pattern of resist and metal. The metal is then etched away with an etching solution to reveal the substrate beneath. The photoresist can then be removed, leaving a pattern of metal and substrate material.

The present etchant solution give excellent control of the etch rate for various metals independent of their position on the substrate and does not promote interaction between different metals such as aluminum and nickel. Although the etch rates for aluminum alone or nickel alone in the etchant are very different, the rates of dissolution are changed when the metals are together in the etchant, such that the etch rates for the different metals are similar.

The temperature of the etchant solution during etching is important and should be maintained between about 25 to about 65° C., preferably from about 48° to 52° C.

The etchant solution of the invention is made by adding the acids and hydrogen peroxide to water and mixing. A small amount of a surface active agent which is stable in acidic solution is optionally added to improve the wetting properties of the etchant to the metal layers. A minimum amount of surfactant is employed; an amount sufficient to change the wetting properties of the solution, but an amount insufficient to dilute the acid content of the solution.

The invention will be further described by the following Examples but the invention is not meant to be limited to the details expressed therein. In the Examples parts are by weight.

EXAMPLE 1

Silicon wafers which were doped to define N and P type regions therein were coated first with a layer of aluminum about 3 microns thick, then with a layer of titanium about 0.3 micron thick to act as a barrier layer with respect to a succeeding layer of nickel about 0.7 micron thick.

The coated wafers were covered with Waycoat SC photoresist and baked at 150° to 160° C. for 1.5 hours. The resist was exposed through a mask and developed to form a desired pattern of resist and metal.

The wafers were then immersed in an etchant solution maintained at about 50° C. for 16 to 20 minutes. The etchant solution was made by mixing 24 parts of 70 percent nitric acid in 1960 parts of water, adding 2 parts of 40 percent hydrofluoric acid, 9 parts of 30 percent hydrogen peroxide, 4 parts of 97 percent sulphuric acid and 1 part of Tergitol surfactant.

Excellent pattern definition was obtained with little undercutting and all of the unprotected metal was removed.

EXAMPLE 2

Doped silicon wafers were passivated with a layer of polycrystalline, oxygen-doped silicon and coated with three metal layers and lithographically patterned as in Example 1. The wafers were immersed in the etchant solution of Example 1 for 20 minutes until the bared metal was removed.

The surface of the exposed polycrystalline silicon passivation layer was examined under a microscope. No damage to this layer was noted.

I claim:

1. A method of etching three or more metal layers on a silicon-containing substrate using a single etchant which comprises applying a photoresist over the metal layers, exposing the photoresist through a mask, developing the photoresist to reveal portions of the metal layers and immersing the wafer in an etchant solution comprising from about 0.5 to 50 percent by weight of nitric acid, from about 0.03 to 1 percent by weight of hydrofluoric acid, from about 0.05 to 0.5 percent by weight of hydrogen peroxide and from about 0.1 to 1.0 percent by weight of sulphuric acid until the metal not covered by photoresist has dissolved.

2. A method according to claim 1 wherein said metal layers comprise a first layer of aluminum from about 0.1 to 8 microns thick; a second layer of titanium, molybdenum or tungsten from about 0.2 to 0.7 micron thick; and a third layer selected from the group consisting of nickel and copper or both from about 0.4 to 2 microns thick.

3. A method according to claim 1 wherein said silicon-containing substrate is selected from the group consisting of silicon, doped silicon, polycrystalline silicon, oxygen-doped polycrystalline silicon, silicon oxide and silicon nitride.

4. A method according to claim 1 wherein the substrate is a silicon wafer, the metal layers are aluminum about 3 microns thick, titanium about 0.3 micron thick and nickel about 0.7 micron thick.

5. A method according to claim 1 wherein the substrate is a polycrystalline, oxygen doped silicon over a doped silicon wafer and the metal layers are aluminum about 3 microns thick, titanium about 0.3 micron thick and nickel about 0.7 micron thick.

* * * * *